United States Patent [19]

Clapper

[11] 3,753,009

[45] Aug. 14, 1973

[54] RESETTABLE BINARY FLIP-FLOP OF THE SEMICONDUCTOR TYPE

[75] Inventor: Steven L. Clapper, Fort Lauderdale, Fla.

[73] Assignee: Motorola, Inc., Franklin Park, Ill.

[22] Filed: Aug. 23, 1971

[21] Appl. No.: 173,894

[52] U.S. Cl. .................. 307/279, 307/215, 307/218, 307/291, 307/304

[51] Int. Cl. .............................................. H03k 3/26

[58] Field of Search ................ 307/221 C, 215, 218, 307/279, 291, 304

[56] References Cited

UNITED STATES PATENTS

| | | | |
|---|---|---|---|
| 3,679,913 | 7/1972 | Foltz | 307/279 |
| 3,493,785 | 2/1970 | Rapp | 307/279 |
| 3,482,172 | 12/1969 | Turecki et al. | 307/291 X |
| 3,339,145 | 8/1967 | MacSorley | 307/218 X |
| 3,431,433 | 3/1969 | Ball et al. | 307/221 |
| 3,474,262 | 10/1969 | Turcotte | 307/218 X |
| 3,539,824 | 11/1970 | Yu et al. | 307/218 |
| 3,588,545 | 6/1971 | Wright | 307/218 X |

*Primary Examiner*—Stanley D. Miller, Jr.
*Attorney*—Vincent Rauner and Eugene A. Parsons et al.

[57] ABSTRACT

A bistable flip-flop circuit utilizing insulated gate field effect transistors in a plurality of AND, NOR and inverter circuits connected to receive a signal and the inverse thereof on two inputs and to supply an output signal and the inverse thereof on two outputs, the outputs being resettable to specific levels upon the application of a reset signal to a reset input.

10 Claims, 5 Drawing Figures

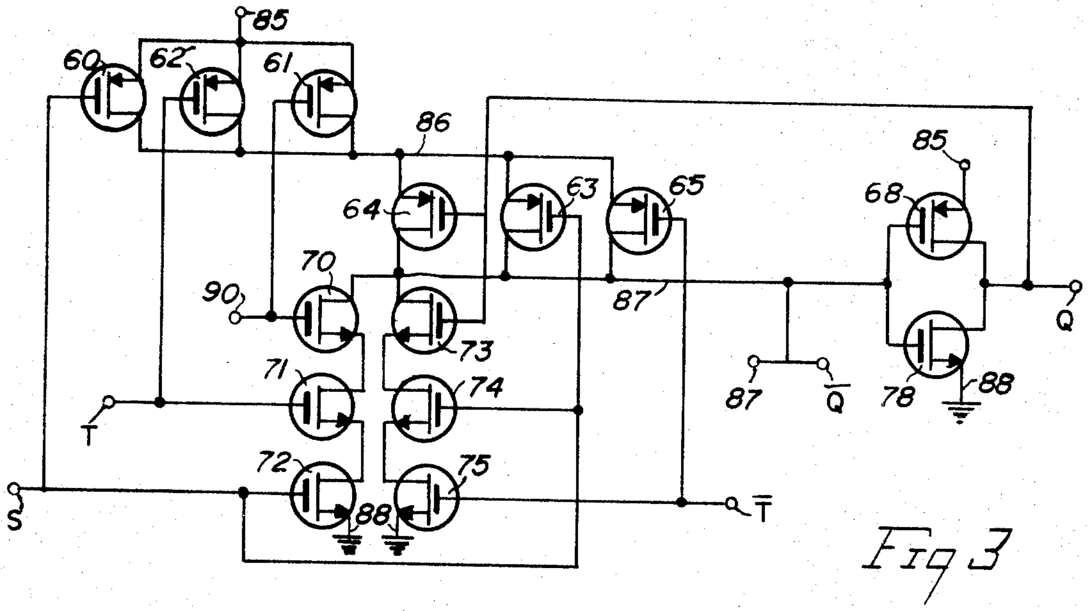
Fig 3
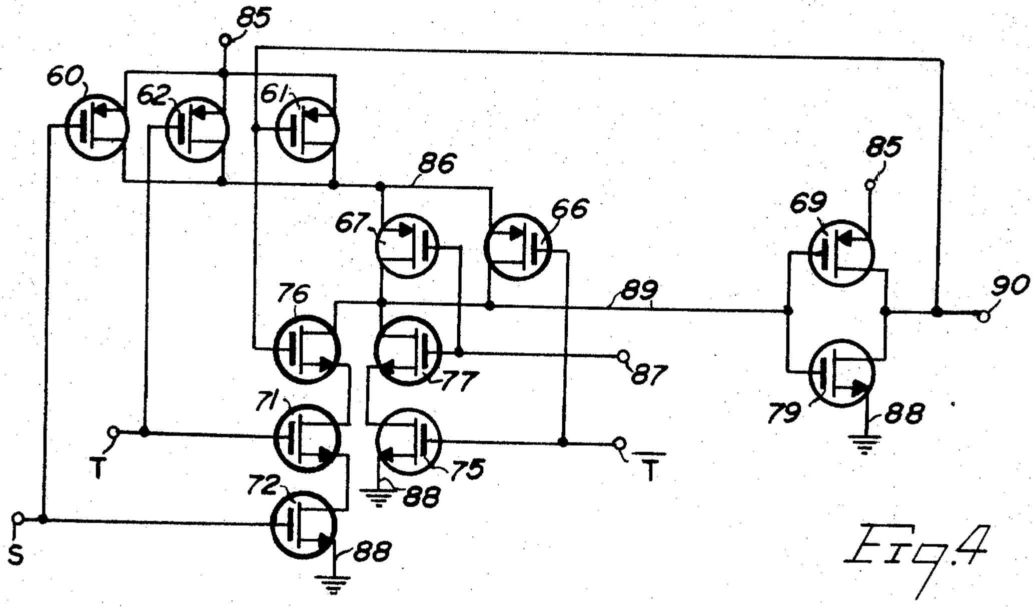
Fig.4
| | T | $\overline{T}$ | $\overline{Q}$ | Q | 90 | 89 | S |
|---|---|---|---|---|---|---|---|
| 1 | 0 | 1 | 0 | 1 | 0 | 1 | 1 |
| 2 | 1 | 0 | 1 | 0 | 0 | 1 | 1 |
| 3 | 0 | 1 | 1 | 0 | 1 | 0 | 1 |
| 4 | 1 | 0 | 0 | 1 | 1 | 0 | 1 |
| 5 | 0 | 1 | 0 | 1 | 0 | 1 | 1 |
| 6 | * | * | 1 | 0 | * | * | 0 |
0=LOW
1=HIGH
*=EITHER
Fig. 5

RESETTABLE BINARY FLIP-FLOP OF THE SEMICONDUCTOR TYPE

BACKGROUND OF THE INVENTION

1. Field of the Invention

The present invention pertains to binary flip-flops of the type formed from semiconductor devices and more specifically insulated gate field effect transistors. Binary or bistable flip-flops are utilized in great numbers in digital systems, such as counters, multiplexers, shift registers and the like. Consequently, it is advantageous to construct the flip-flop as small and as inexpensively as possible. The advent of integrated circuits has greatly reduced the size and cost of binary flip-flops but, because of the necessity for inactive devices such as resistors and capacitors therein, the process for constructing these flip-flops is relatively complicated and expensive. It is, therefore, advantageous to construct a binary flip-flop completely from semiconductor devices.

2. Description of the Prior Art

In the prior art a binary flip-flop is disclosed, which is fabricated from semiconductor devices, in particular insulated gate field effect transistors, and contains no inactive devices. This circuit, however, is not resettable and the output depends strictly upon the history of signals applied thereto. In many applications it is desirable to reset binary flip-flops to a known level without the necessity of reviewing the history of the input signal and applying a series of signals to reach the desired level. In particular, the present invention is an improvement over the binary flip-flop disclosed in U.S. Pat. No. 3,679,913, entitled "Binary Flip-Flops Employing Insulated Gate Field Effect Transistors and Suitable For Cascaded Frequency Divider Operation" and assigned to the same assignee.

SUMMARY OF THE INVENTION

The present invention pertains to a resettable binary flip-flop of the semiconductor type including twenty semiconductor devices connected in a plurality of AND, NOR and inverter functional configurations to provide a bistable circuit which is resettable, upon the application of a reset signal thereto, to a predetermined output level.

It is an object of the present invention to provide an improved binary flip-flop of the semiconductor type which is resettable.

It is a further object of the present invention to provide a resettable binary flip-flop utilizing semiconductor devices exclusively as the components thereof.

It is a further object of the present invention to provide a resettable binary flip-flop utilizing a minimum of components and which can be relatively easily integrated if desired.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the FIGS:

FIG. 3 is a schematic diagram of a portion of the logic circuitry illustrated in FIG. 1;

FIG. 4 is a schematic diagram of a portion of the logic circuitry illustrated in FIG. 1; and FIG. 5 is a truth table for the resettable binary flip-flop illustrated in FIG. 1.

DESCRIPTION OF THE PREFERRED EMBODIMENT

Figure 1:
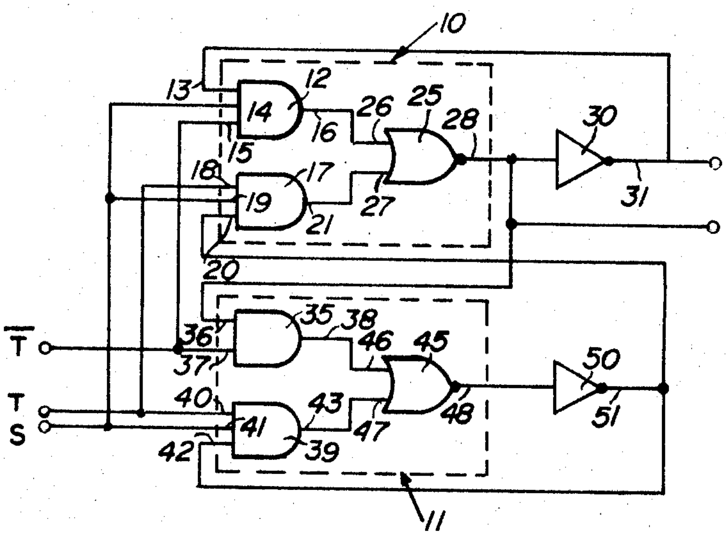
FIG. 1 is a logic block diagram for a resettable binary flip-flop.

Referring specifically to FIG. 1, a logic diagram is illustrated including a first logic circuit generally designated 10 and a second logic circuit generally designated 11. The logic circuit 10 includes an AND circuit 12, having three inputs 13, 14 and 15 and an output 16; a second AND circuit 17, having three inputs 18, 19 and 20 and an output 21; and a NOR circuit 25, having two inputs 26 and 27 connected to the outputs 16 and 21, respectively, of the AND circuits 12 and 17 and an output 28. The output 28 of the NOR circuit 25 is attached to an input of an inverter circuit 30, which inverter circuit 30 has an output 31 which will be explained presently. The second logic circuit 11 includes a first AND circuit 35, having two inputs 36 and 37 and an output 38; a second AND circuit 39, having three inputs 40, 41 and 42 and an output 43; and a NOR circuit 45, having two inputs 46 and 47 attached to the outputs 38 and 43, respectively, of the AND circuits 35 and 39. The NOR circuit 45 has an output 48 which is attached to the input of an inverter circuit 50 having an output 51.

The output 31 of the inverter 30 is attached to an output terminal Q and is further attached to the input 13 of the AND circuit 12. The input 14 of the AND circuit 12 is connected to the input 19 of the AND circuit 17 and to the input 41 of the AND circuit 39 as well as to a reset terminal S. The input 15 of the AND circuit 12 is connected to the input 37 of the AND circuit 35 and to an input terminal T. The input terminal 18 of the AND circuit 17 is connected to the input terminal 40 of the AND circuit 39 and to an input terminal T. The input 20 of the AND circuit 17 is connected to the output 51 of the inverter circuit 50 and to the input 42 of the AND circuit 39. The input 36 of the AND circuit 35 is connected to the output 28 of the NOR circuit 25 and to an output terminal Q. The input terminal T is adapted to have applied thereto an input signal which is the inverse of an input signal applied to the input terminal T. The output terminal Q is attached to the input of the inverter 30 and the output terminal Q is attached to the output 31 of the inverter 30 so that the two terminals Q and Q have inverse output signals thereon.

In the logic diagram of FIG. 1, a high voltage or current level is a logical one (1) while a lower voltage or current level is a logical zero (0). The AND gates 12, 17, 35 and 39 operate in a standard fashion wherein the output of a specific AND circuit is high when all of the inputs to that AND circuit are high and the output is low if one or all of the inputs are low. The NOR gates 25 and 45 also operate in a standard fashion in that if one or both of the inputs is high the output is low and if both inputs are low the output is high. The inverter operation is also standard and a signal is supplied at the output which is the opposite of the signal applied at the input.

Figure 2:
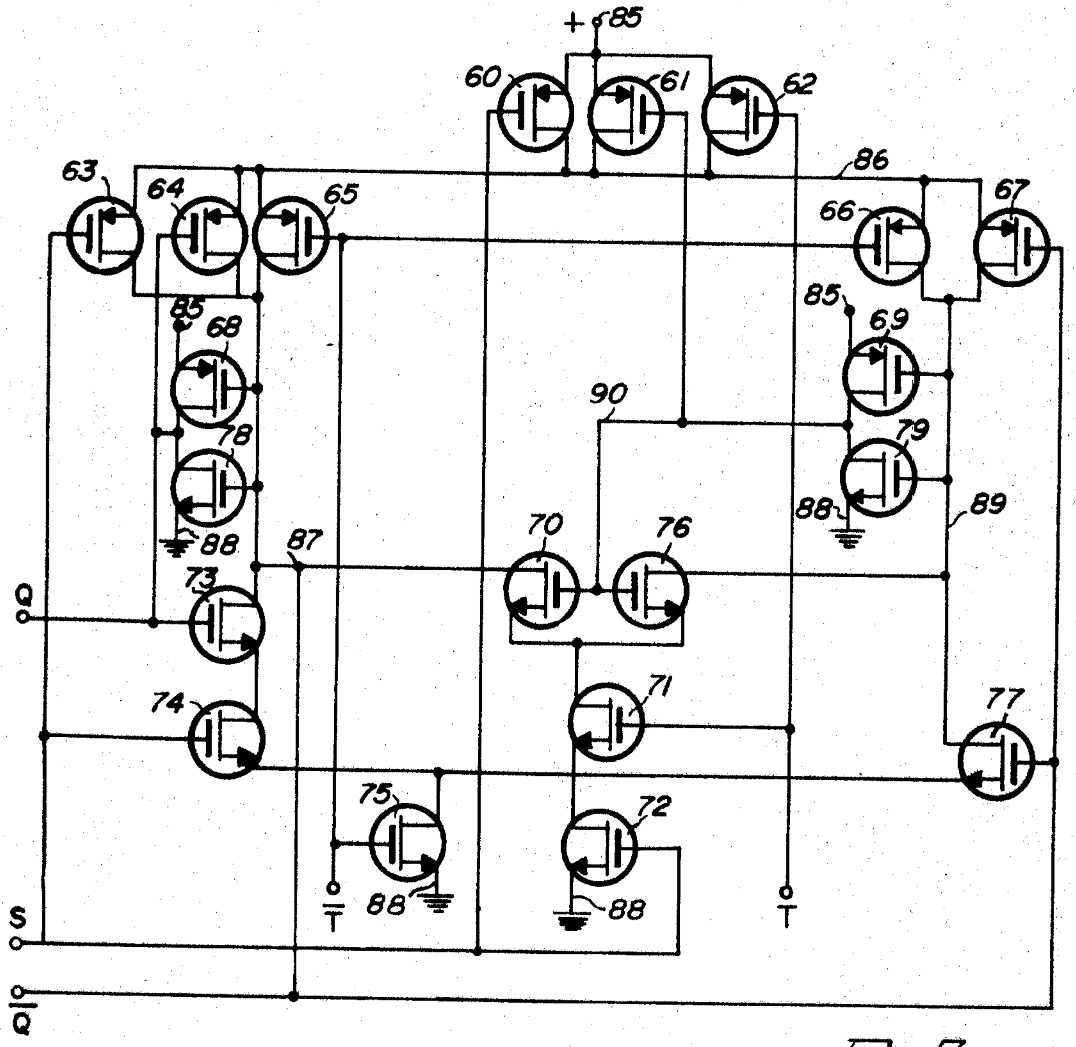
FIG. 2 is a schematic diagram for the resettable binary flip-flop illustrated in logic form in FIG. 1.

The binary flip-flop illustrated logically in FIG. 1 is illustrated schematically in FIG. 2. In FIG. 2, 10 P-channel insulated gate field effect transistors 60–69 are utilized and ten N-channel insulated gate field effect transistors 70–79 are utilized. Each of the transistors 60–79 is illustrated schematically by a long line with a short parallel line spaced therefrom to represent the gate. The source of each of the transistors 60–79 is illustrated by an arrow attached perpendicularly to the long line and the drain is illustrated by a plain line attached perpendicularly to the long line. The direction of the arrow indicates the direction of the current through the transistor. The arrow head points toward the long line in the P-channel transistors and away from the long line in the N-channel transistors. The P-channel transistors conduct from the source to the drain when the gate is negative, relative to the source and the N-channel transistors conduct from the drain to the source when the gate is positive, relative to the source. It should be understood that insulated gate field effect transistors are utilized in this preferred embodiment because of their superior characteristics, but other semiconductor devices, such as junction field effect transistors, etc., might be utilized by those skilled in the art.

The sources of the transistors 60, 61 and 62 are connected to a positive source of voltage 85 and the drains are connected to a terminal or line 86, which is in turn connected to the sources of transistors 63, 64, 65, 66 and 67. The drains of the transistors 63, 64 and 65 are connected together and to the gates of transistors 68 and 78 and to the drains of transistors 70 and 73 by means of a terminal or line 87. Line 87 is further connected to the Q output terminal and to the gates of transistors 67 and 77. The source of the transistor 68 is connected to the positive voltage source 85, the drain is connected to the drain of the transistor 78 and the source of the transistor 78 is connected to ground or a common lead 88. The gate of the transistor 64 is connected to the interconnected drains of the transistors 68 and 78, to the gate of the transistor 73 and to the output terminal Q. The source of the transistor 73 is connected to the drain of the transistor 74 and the source of the transistor 74 is connected to the drain of the transistor 75 and the source of the transistor 77. The gate of the transistor 63 is connected to the gate of the transistor 74, to the gate of the transistor 72, to the gate of the transistor 60 and to the reset input terminal S. The gate of the transistor 65 is connected to the gate of the transistor 66, the gate of the transistor 75 and to the input terminal T. The source of the transistor 75 is connected to ground 88. The gate of the transistor 61 is connected to the drains of transistors 69 and 79 and to the gates of transistors 70 and 76 by means of a line or terminal 90. The gate of the transistor 62 is connected to the gate of the transistor 71 and to the input terminal T. The source of the transistor 70 is connected to the source of the transistor 76 and to the drain of the transistor 71. The source of the transistor 71 is connected to the drain of the transistor 72 and the source thereof is connected to ground 88. The drains of transistors 66 and 67 are connected to the gates of the transistors 69 and 79 and to the drains of transistors 76 and 77 by means of a terminal or lead 89. The source of transistor 69 is connected to the positive source of voltage 85 and the source of transistor 79 is connected to ground 88.

The schematic representation of the binary flip-flop illustrated in FIG. 2 is redrawn and divided into the first logic circuit 10 and inverter 30, illustrated in FIG. 3, and the second logic circuit 11 and inverter 50, illustrated in FIG. 4. Six of the transistors, 60, 61, 62, 71, 72 and 75 are utilized in both of the logic circuits 10 and 11 and, consequently, because of this dual function these transistors are illustrated in both FIGS. 3 and 4. All of the transistors, terminals and lines illustrated in FIGS. 3 and 4 coincide with similar components in FIG. 2 and are designated with similar numbers.

Referring to FIG. 3, it can be seen that the first logic circuit 10 includes three transistors 60, 61 and 62 connected with the sources and drains in parallel between the positive voltage supply 85 and the line 86; three transistors 63, 64 and 65 connected with the sources and drains in parallel between the first line 86 and a second line 87; three transistors 70, 71 and 72 connected with the drains and sources in series between the line 87 and ground 88; and three transistors 73, 74 and 75 connected in series between the line 87 and ground 88. The gates of the three transistors 70, 71 and 72 are connected to the gates of transistors 61, 62 and 60, respectively, and to line 90 (the output of inverter 50), input terminal T and input terminal S, respectively. The gates of transistors 73, 74 and 75 are connected to the gates of transistors 64, 63 and 65, respectively, and to the output of inverter 30 (terminal Q), terminal S and terminal T. The line 87 is connected to the gates of transistors 68 and 78 (inverter 30) and serves as an input thereto from the first logic circuit 10. Further, it should be noted that the six parallel connected transistors 60–65 are P-channel transistors requiring negative signals on the gate for conduction thereof and the six series connected transistors 70–75 are N-channel transistors requiring a positive signal on the gate for conduction thereof. Thus, whenever all three terminals 90, T and S are positive all three transistors 60, 61 and 62 are nonconducting and all three transistors 70, 71 and 72 are conducting so that the line 87 is substantially at ground potential or low. If all three of the terminals Q, S and T are positive the three transistors 63, 64 and 65 are nonconducting and the three transistors 73, 74 and 75 are conducting so that the line 87 is substantially at ground potential or low. If any one of the three terminals 90, T and S have a low or ground potential applied thereto and if any one of the three terminals Q, S and T have a low or ground potential applied thereto the corresponding one of the three transistors 60, 61 and 62 is conducting with the corresponding one of the three transistors 70, 71 and 72 nonconducting and the corresponding one of the three transistors 63, 64 and 65 is conducting with the corresponding one of the three transistors 73, 74 and 75 nonconducting so that the line 87 is substantially at the potential of the positive power supply 85.

Referring to FIG. 4, the second logic circuit 11 includes three transistors 60, 61 and 62 connected with the sources and drains in parallel between the positive voltage potential 85 and the line 86; two transistors 66 and 67 connected with the sources and drains in parallel between the line 86 and the line 89; three transistors 76, 71 and 72 connected with the drains and sources in series between the line 89 and ground 88; and two transistors 77 and 75 connected with the drains and sources in series between the line 89 and ground 88. The gates of the three transistors 76, 71 and 72 are connected to the gates of the three transistors 61, 62 and 60, respectively, and to terminal 90, terminal T and terminal S, respectively. The gates of transistors 77 and 75 are connected to the gates of transistors 66 and 67, respectively, and to terminals 87 and T, respectively. Line 89 is connected to the gates of transistors 69 and 79 (converter 50) with the drains or output connected to terminal 90. If all of the terminals 90, T and S have a positive potential applied thereto the three transistors 60, 61 and 62 are nonconducting and the three transistors 76, 71 and 72 are conducting so that the line 89 is substantially at ground potential. If both of the terminals 87 and T have a positive potential applied thereto the two transistors 66 and 67 are nonconducting and the two transistors 77 and 75 are conducting so that the line 89 is substantially at ground potential. If any one of the terminals 90, T or S has a low or ground potential applied thereto and if either one of the terminals 87 or T has a low or ground potential applied thereto, the corresponding one of the transistors 60, 61 and 62 is conducting with the corresponding one of the transistors 76, 71 and 72 nonconducting and the corresponding one of the transistors 66 and 67 is conducting with the corresponding one of the transistors 77 and 75 nonconducting so that the line 89 is substantially at the positive potential of terminal 85.

In the present embodiment the reset terminal S is retained at a high potential throughout normal operation of the binary flip-flop. Referring to FIGS. 3 and 4, with terminal S at a high potential the transistors 60 and 63 are nonconducting and the transistors 72 and 74 are conducting so that the entire circuit operates as if the transistors 60, 63, 72 and 74 were not present therein. With the S terminal at a positive potential, the operation of the binary flip-flop is apparent from the first five conditions set forth in the truth table of FIG. 5. When the reset terminal S is lowered to zero or ground potential, the transistors 60 and 63 conduct and the transistors 72 and 74 are nonconducting so that the line 87 is substantially at the positive potential of terminal 85 and the output terminal Q is at zero or ground potential. Referring to the truth table of FIG. 5, it can be seen that the output terminal Q is at the low or ground potential and the inverse output terminal Q is substantially at the potential of terminal 85 when the reset terminal S is low or at ground potential. Referring specifically to FIG. 3, when a low or ground potential is applied to the terminal S the transistors 72 and 74 are nonconducting, thereby preventing the inadvertent grounding of line 87 through a series combination of transistors, and the transistors 60 and 63 are conducting, thereby applying the positive potential of terminal 85 to the line 87. Further, referring to FIG. 4, the application of a low potential to the reset terminal S causes the transistor 72 to be nonconducting to prevent the three series connected transistors 76, 71 and 72 from grounding the line 89 and, the positive potential at the terminal 85, if the binary flip-flop is reset during certain conditions (condition 4 of the truth table).

Thus, a resettable binary flip-flop is disclosed which can be reset to a predetermined condition, which in the present embodiment is a low potential at the Q terminal and a high potential at the Q terminal, regardless of the condition or potentials present on the various input and output terminals, of the binary flip-flop. Further, the binary flip-flop operates in a normal manner when the potential applied to the reset terminal is at a predetermined level, in the present embodiment this predetermined level is high. It should be understood that one skilled in the art might alter the present embodiment so that the reset level and the output levels of the flip-flop is the inverse of that described in the present embodiment. The binary flip-flop has been rendered resettable by the addition of four semiconductor devices so that the circuit remains relatively simple and easy to integrate, if desired.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. In a resettable binary flip-flop of the semiconductor type having first, second, third and fourth AND gate circuits each having a plurality of inputs and an output, first and second NOR gate circuits each having a plurality of inputs and an output, the outputs of said first and second AND gate circuits being connected to two inputs of said first NOR gate circuit and the outputs of said third and fourth AND gate circuits being connected to two inputs of said second NOR gate circuit, and first and second inverter circuits each having an input and an output, the output of said first NOR gate circuit being connected to the input of said first inverter circuit and to an input of said third AND gate circuit, the output of said second NOR gate circuit being connected to the input of said second inverter circuit, the output of said first inverter being connected to an input of said first AND gate circuit and the output of said second inverter circuit being connected to an input of said second AND gate circuit and an input of said fourth AND gate circuit, an input of each of said second and fourth AND gate circuits being connected together for receiving an input signal thereon and an input of each of said first and third AND gate circuits being connected together for receiving a signal which is the inverse of the input signal thereon, the improvement comprising:

a. an input of each of said first, second and fourth AND gate circuits being connected together for receiving a reset signal thereon, b. said first and second AND gate circuits and said connected first NOR gate circuit including a plurality of field effect transistors connected in parallel therein and a plurality of field effect transistors connected in series therein and further connected for receiving the reset signals on the gate of at least one of said parallel and one of said series transistors; and c. said third and fourth AND gate circuits and the connected second NOR gate circuit including a plurality of field effect transistors connected in parallel therein and a plurality of field effect transistors connected in series therein and further connected for receiving the reset signal on the gate of at least one of said parallel and one of said series transistors, said additional semiconductor devices serving to reset the flip-flop to a predetermined output condition and to prevent operation of the flip-flop, regardless of the signals present at the inputs of the various circuits during reset.

2. A resettable binary flip-flop of the semiconductor type comprising:

a. first, second, third and fourth AND gate circuits each having a plurality of inputs and an output;
b. first and second NOR gate circuits each having a plurality of inputs and an output, the outputs of said first and second AND gate circuits being connected to two inputs of said first NOR gate circuit and the outputs of said third and fourth AND gate circuits being connected to two inputs of said second NOR gate circuit;
c. said first and second AND gate circuits and said first NOR gate circuit forming a first logic circuit including
 1. twelve semiconductor means each having the equivalent of a source, a gate and a drain,
 2. first, second and third semiconductor means being connected with the sources and drains in parallel between a line adapted to be connected to a source of voltage and a first terminal,
 3. fourth, fifth and sixth semiconductor means being connected with the sources and drains in parallel between said first terminal and a second terminal,
 4. seventh, eighth and ninth semiconductor means being connected with the sources and drains in series between said second terminal and a common line,
 5. tenth, 11th and 12th semiconductor means being connected with the sources and drains in series between said second terminal and a common line,
 6. the gates of said first, second and third semiconductor means being connected one each to one of the gates of said seventh, eighth and ninth semiconductor means, and
 7. the gates of said fourth, fifth and sixth semiconductor means being connected one each to one of the gates of said 10th, 11th and 12th semiconductor means;
d. first and second inverter circuits each having an input and an output, the output of said first NOR gate circuit being connected to the input of said first inverter circuit, and to an input of said third AND gate circuit the output of said second NOR gate circuit being connected to the input of said second inverter circuit, the output of said first inverter being connected to an input of said first AND gate circuit, and the output of said second inverter circuit being connected to an input of said second AND gate circuit and an input of said fourth AND gate circuit; and
e. an input of each of said first, second and fourth AND gate circuits being connected together for receiving a reset signal thereon, an input of each of said second and fourth AND gate circuits being connected together for receiving an input signal thereon, and an input of each of said first and third AND gate circuits being connected together for receiving a signal which is the inverse of the input signal thereon.

3. A resettable binary flip-flop as set forth in claim 2 wherein the third and fourth AND gate circuits and the second NOR gate circuit comprise a second logic circuit including
 1. ten semiconductor means each having the equivalent of a source, a gate and a drain;
 2. first, second and third semiconductor means being connected with the sources and drains in parallel between a line adapted to be connected to a source of voltage and a first terminal;
 3. fourth and fifth semiconductor means being connected with the sources and drains in parallel between said first terminal and a second terminal;
 4. sixth, seventh and eighth semiconductor means being connected with the sources and drains in series between said second terminal and a common line;
 5. ninth and 10th semiconductor means being connected with the sources and drains in series between said second terminal and a common line;
 6. the gates of said first, second and third semiconductor means being connected one each to one of the gates of said sixth, seventh and eighth semiconductor means; and
 7. the gates of said fourth and fifth semiconductor means being connected one each to one of the gates of said ninth and 10th semiconductor means.

4. A resettable binary flip-flop as set forth in claim 3 wherein three transistors are utilized to provide the dual functions of the first, second and third semiconductor means in the first and the second logic circuits; three transistors are utilized to provide the dual functions of the eighth, ninth and 12th semiconductor means of the first logic circuit and the seventh, eighth and 10th semiconductor means of the second logic circuit; and the remaining semiconductor means are transistors each performing a single function.

5. A resettable binary flip-flop as set forth in claim 4 wherein the transistors are field effect transistors.

6. a resettable binary flip-flop as set forth in claim 2 wherein the 12 semiconductor means include
 1. six P-channel type and six N-channel type field effect transistors each having a source, a gate and a drain;
 2. first, second and third P-channel transistors being connected in parallel, with the sources adapted to be connected to a positive source of voltage and the drains connected to a first terminal;
 3. fourth, fifth and sixth P-channel transistors being connected in parallel with the sources connected to said first terminal and the drains connected to a second terminal;
 4. first, second and third N-channel transistors being connected in series between said second terminal and a common line;
 5. fourth, fifth and sixth N-channel transistors being connected in series between said second terminal and the common line;
 6. the gates of said first, second and third P-channel transistors being connected one each to one of the gates of said first, second and third N-channel transistors; and
 7. the gates of said fourth, fifth and sixth P-channel transistors being connected one each to one of the gates of said fourth, fifth and sixth N-channel transistors.

7. A resettable binary flip-flop as set forth in claim 2 wherein the 10 semiconductor means include
 1. five P-channel type and five N-channel type field effect transistors each having a source, a gate and a drain;
 2. first, second and third P-channel transistors being connected in parallel, with the sources adapted to be connected to a positive source of voltage and the drains connected to a first terminal;

3. fourth and fifth P-channel transistors being connected in parallel, with the sources connected to said first terminal and the drains connected to a second terminal;
4. first, second and third N-channel transistors being connected in series between said second terminal and a common line;
5. fourth and fifth N-channel transistors being connected in series between said second terminal and the common line;
6. the gates of said first, second and third P-channel transistors being connected one each to one of the gates of said first, second and third N-channel transistors; and
7. the gates of said fourth and fifth P-channel transistors being connected one each to one of the gates of said fourth and fifth N-channel transistors.

8. A resettable binary flip-flop as set forth in claim 6 wherein the third and fourth AND gate circuits and the second NOR gate circuit comprise a second logic circuit including 1. five P-channel type and five N-channel type field effect transistors each having a source, a gate and a drain;
2. first, second and third P-channel transistors being connected in parallel, with the sources adapted to be connected to a positive source of voltage and the drains connected to a first terminal;
3. fourth and fifth P-channel transistors being connected in parallel, with the sources connected to said first terminal and the drains connected to a second terminal;
4. first, second and third N-channel transistors being connected in series between said second terminal and a common line;
5. fourth and fifth N-channel transistors being connected in series between said second terminal and the common line;
6. the gates of said first, second and third P-channel transistors being connected one each to one of the gates of said first, second and third N-channel transistors; and
7. the gates of said fourth and fifth P-channel transistors being connected one each to one of the gates of said fourth and fifth N-channel transistors.

9. A resettable binary flip-flop of the semiconductor type comprising:

a. a first logic circuit including
   1. twelve semiconductor means each having the equivalent of a source, a gate and a drain;
   2. first, second and third semiconductor means being connected with the sources and drains in parallel between a line adapted to be connected to a source of voltage and a first terminal;
   3. fourth, fifth and sixth semiconductor means being connected with the sources and drains in parallel between said first terminal and a second terminal;
   4. seventh, eighth and ninth semiconductor means being connected with the sources and drains in series between said second terminal and a common line;
   5. tenth, 11th and 12th semiconductor means being connected with the sources and drains in series between said second terminal and a common line;
   6. the gates of said first, second and third semiconductor means being connected one each to one of the gates of said seventh, eighth and ninth semiconductor means; and
   7. the gates of said fourth, fifth and sixth semiconductor means being connected one each to one of the gates of said 10th, 11th and 12th semiconductor means;

b. a second logic circuit including
   1. ten semiconductor means each having the equivalent of a source, a gate and a drain;
   2. first, second and third semiconductor means being connected with the sources and drains in parallel between a line adapted to be connected to a source of voltage and a first terminal;
   3. fourth and fifth semiconductor means being connected with the sources and drains in parallel between said first terminal and a second terminal;
   4. sixth, seventh and eighth semiconductor means being connected with the sources and drains in series between said second terminal and a common line;
   5. ninth and tenth semiconductor means being connected with the sources and drains in series between said second terminal and a common line;
   6. the gates of said first, second and third semiconductor means being connected one each to one of the gates of said sixth, seventh and eighth semiconductor means; and
   7. the gates of said fourth and fifth semiconductor means being connected one each to one of the gates of said ninth and 10th semiconductor means;

c. first and second inverter circuits each having an input and an output, the second terminal of said first logic circuit being connected to the input of said first inverter circuit, and to the gate of the fourth semiconductor means of said second logic circuit, the second terminal of said second logic circuit being connected to the input of said second inverter circuit, the output of said first inverter circuit being connected to the gate of the fourth semiconductor means of said first logic circuit, and the output of said second inverter circuit being connected to the gates of the third semiconductor means of each of said first and second logic circuits; and d. the gates of the second semiconductor means of each of the first and second logic circuits being connected to receive an input signal, the gates of the sixth semiconductor means of the first logic circuit and the fifth semiconductor means of the second logic circuit being connected to receive a signal which is the inverse of the input signal, and the gates of the first, fifth and ninth semiconductor means of the first logic circuit and the first and eighth semiconductor means of the second logic circuit being connected to receive a reset signal thereon.

10. A resettable binary flip-flop of the semiconductor type comprising:

a. first, second, third and fourth AND gate circuits each having a plurality of inputs and an output;

b. first and second NOR gate circuits each having a plurality of inputs and an output, the outputs of said first and second AND gate circuits being connected to two inputs of said first NOR gate circuit and the outputs of said third and fourth AND gate circuits being connected to two inputs of said second NOR gate circuit;

c. said third and fourth AND gate circuits and said second NOR gate circuit forming a second logic circuit including 1. ten semiconductor means each having the equivalent of a source, a gate and a drain,
2. first, second and third semiconductor means being connected with the sources and drains in parallel between a line adapted to be connected to a source of voltage and a first terminal,
3. fourth and fifth semiconductor means being connected with the sources and drains in parallel between said first terminal and a second terminal,
4. sixth, seventh and eighth semiconductor means being connected with the sources and drains in series between said second terminal and a common line,
5. ninth and tenth semiconductor means being connected with the sources and drains in series between said second terminal and a common line,
6. the gates of said first, second and third semiconductor means being connected one each to one of the gates of said sixth, seventh and eighth semiconductor means, and
7. the gates of said fourth and fifth semiconductor means being connected one each to one of the gates of said ninth and 10th semiconductor means;

d. first and second inverter circuits each having an input and an output, the output of said first NOR gate circuit being connected to the input of said first inverter circuit, and to an input of said third AND gate circuit the output of said second NOR gate circuit being connected to the input of said second inverter circuit, the output of said first inverter being connected to an input of said first AND gate circuit, and the output of said second inverter circuit being connected to an input of said second AND gate circuit and an input of said fourth AND gate circuit; and e. an input of each of said first, second and fourth AND gate circuits being connected together for receiving a reset signal thereon, an input of each of said second and fourth AND gate circuits being connected together for receiving an input signal thereon, and an input of each of said first and third AND gate circuits being connected together for receiving a signal which is the inverse of the input signal thereon.

* * * * *